US006693456B2

(12) United States Patent
Wong

(10) Patent No.: US 6,693,456 B2
(45) Date of Patent: Feb. 17, 2004

(54) INTERCONNECTION NETWORK FOR A FIELD PROGRAMMABLE GATE ARRAY

(75) Inventor: Dale Wong, San Francisco, CA (US)

(73) Assignee: Leopard Logic Inc., Cupertino, CA (US)

( * ) Notice: Subject to any disclaimer, the term of this patent is extended or adjusted under 35 U.S.C. 154(b) by 0 days.

(21) Appl. No.: 09/923,294

(22) Filed: Aug. 3, 2001

(65) Prior Publication Data

US 2002/0113619 A1 Aug. 22, 2002

Related U.S. Application Data

(60) Provisional application No. 60/223,047, filed on Aug. 4, 2000.

(51) Int. Cl.$^7$ .......................... H03K 19/173; G06F 7/38
(52) U.S. Cl. ........................... 326/41; 326/38; 710/317
(58) Field of Search .............................. 326/38, 39, 40, 326/41, 47; 710/317

(56) References Cited

U.S. PATENT DOCUMENTS

| | | | | |
|---|---|---|---|---|
| 5,299,317 A | * | 3/1994 | Chen et al. ................ 395/325 |
| 5,349,248 A | * | 9/1994 | Parlour et al. .............. 307/465 |
| 5,519,629 A | | 5/1996 | Snider ........................ 364/490 |
| 5,530,813 A | | 6/1996 | Paulsen et al. ............. 395/312 |
| 5,987,028 A | * | 11/1999 | Yang et al. ................. 370/380 |

FOREIGN PATENT DOCUMENTS

| EP | 0919938 | 6/1999 | ........... G06F/17/50 |
|---|---|---|---|
| JP | 03098353 | 4/1991 | ........... H04L/12/48 |

OTHER PUBLICATIONS

Chan et al. "Architectural Tradeoffs in Field–Programmable–Device–Based Computing Systems," FPGAS for Custom Computing Machines, Proceedings, IEEE Workshop on Napa, CA USA Apr. 5–7, 1993, pp. 152–161.

* cited by examiner

Primary Examiner—Daniel Chang
(74) Attorney, Agent, or Firm—Ritter, Lang & Kaplan LLP

(57) ABSTRACT

An interconnection network architecture which provides an interconnection network which is especially useful for FPGAs is described. Based upon Benes networks, the resulting network interconnect is rearrangeable so that routing between logic cell terminals is guaranteed. Upper limits on time delays for the network interconnect are defined and pipelining for high speed operation is easily implemented. The described network interconnect offers flexibility so that many design options are presented to best suit the desired application.

29 Claims, 12 Drawing Sheets

US 6,693,456 B2

INTERCONNECTION NETWORK FOR A FIELD PROGRAMMABLE GATE ARRAY

CROSS-REFERENCES TO RELATED APPLICATIONS

This patent application claims priority from Provisional Patent Application No. 60/223,047, filed Aug. 4, 2000 and is hereby incorporated by reference.

BACKGROUND OF THE INVENTION

The present invention relates to integrated circuit interconnections and, in particular, to the interconnection architecture of FPGA (Field Programmable Gate Array) integrated circuits.

FPGAs are integrated circuits whose functionalities are designated by the users of the FPGA. The user programs the FPGA (hence the term, "field programmable") to perform the functions desired by the user.

A very significant portion of an FPGA's design is the integrated circuit's interconnection network between the logic cells or blocks, which perform the functions of the FPGA. Heretofore, the current practice for designing an FPGA interconnection architecture has been empirical and on an ad hoc basis. The goal of the FPGA designer has been to create an interconnect structure which is sufficiently flexible to implement the required wiring for any circuit design intended for the FPGA, and yet occupies a minimal amount of area of the integrated circuit and with a minimal amount of transmission delay. In today's FPGA products, the interconnect network typically occupies about 90% of the chip area and the actual logic cells occupy only about 5% of the chip. In other words, most of the area of the integrated circuit is not dedicated to the circuits performing desired functions of the FPGA, but rather to the interconnections between those circuits.

Furthermore, the current practice for designing FPGA interconnects is empirical and on an ad hoc basis. The users of these FPGA products spend most of their design time trying to make their circuits route to obtain the desired functions and to meet the timing constraints. The rule of thumb is to only utilize 50% of the available logic cells in order to guarantee they can all be routed through the interconnect network. If the timing constraints are relatively high speed, then the rule of thumb is to only utilize 33% of the logic cells in order to avoid the need for detours and longer delays in the routing.

Hence, there is a need for an FPGA interconnection network architecture by which routing through the resulting interconnect network is guaranteed and that the timing constraints of the interconnect network are predictable. The present invention provides for such an interconnection network.

SUMMARY OF THE INVENTION

The present invention provides for an integrated circuit having a plurality of logic cells; and a programmable network interconnecting the logic cells. The programmable interconnection network has a plurality of interconnection network input terminals; a plurality of programmable switches, each programmable switch having a plurality of input terminals and output terminals with the programmable switch arranged so that signals on any input terminal are passed to any output terminal. The plurality of programmable switches interconnecting the plurality of interconnection network input terminal to the interconnection network output terminal are arranged in a Benes network so that connections between the interconnection network input terminals and interconnection network output terminals are rearrangeable.

The plurality of programmable switches are arranged in hierarchical levels with a first level of the programmable switches having input terminals connected to the interconnection network input terminals and a last level of the programmable switches having output terminals connected to the interconnection network output terminals. The levels of the programmable switches intermediate the first and last level are arranged in a plurality of first rank sub-interconnection networks equal to the number of switch output terminals. Each first rank sub-interconnection network is connected to an output terminal of each programmable switch in the first level and connected to an input terminal of each programmable switch in the last level. In a similar arrangement, the first rank sub-interconnection networks themselves are formed from second rank sub-interconnection networks and so forth.

BRIEF DESCRIPTION OF THE DRAWINGS

FIG. 2A is a diagram of another operation of a 2×2 switch for a Benes network.

DESCRIPTION OF THE SPECIFIC EMBODIMENTS

Figure 1:
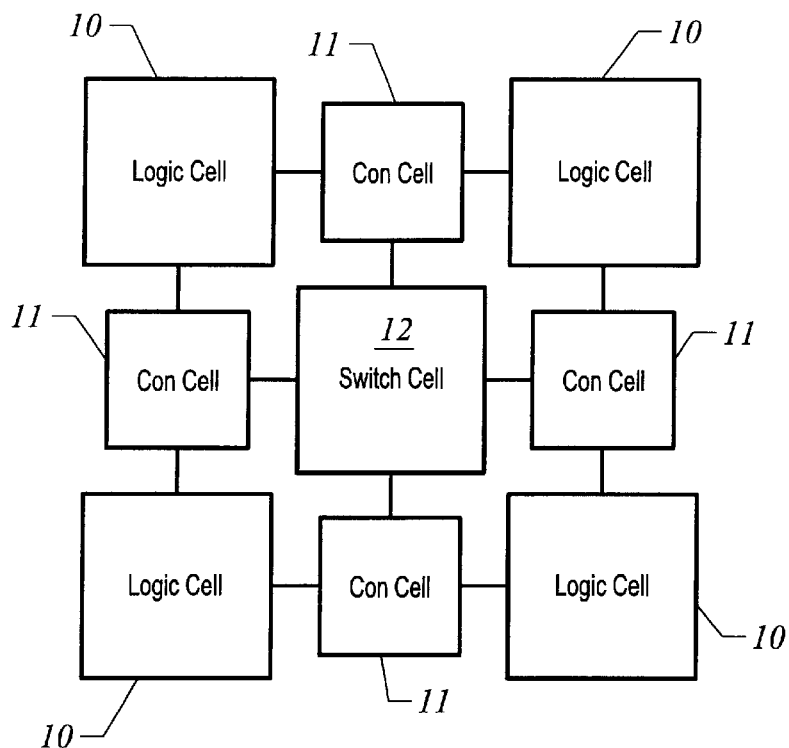
FIG. 1 is a diagram of the interconnection architecture of a current SRAM-based FPGA.

Current SRAM (Static Random Access Memory)-based FPGA products conform to the interconnect architecture as illustrated in FIG. 1: The basic structure of FIG. 1 has logic cells 10,which implement the desired circuit logic by the user, connection cells 11 which connect logic cells 10 to the interconnect network, and switch cells 12 which implement the interconnect network. Additional connections are made between a switch cell 12 and its four neighboring switch cells 12 in the north, east, west, and south directions. The switch cells 12, connection cells 11, and all their wires and connections constitute the interconnect network of the FPGA. This basic unit is arrayed to build FPGAs of varying sizes.

The flexibility of this architecture lies within the connection cell 11 and the switch cell 12. In common terminology, a fully "populated" connection cell 11 will connect each pin of the logic cell 10 to every wire connecting to the switch cell 12. A "depopulated" connection cell 11 will connect each pin of the logic cell to a subset of the wires connecting to the switch cell 12, with each pin connecting to a different, possibly overlapping, subset of wires. Similarly, a fully "populated" switch cell will provide full crossbar connections between all the wires on all four of its sides, and a "depopulated" switch cell will only provide a subset of these connections. Lastly, the set of wires between any two cells is called a "channel", and the number of wires in a channel can be varied.

Each possible connection in the FPGA interconnect network requires its own pass gate and controlling configuration bit. A fully populated interconnect network is prohibitively expensive to implement and the current practice has been to build a parameterized software model that can represent varying depopulated interconnect networks. Then various representative logic designs are tried onto the modeled networks. Based on this empirical data, a judgment must be made about what constitutes an "acceptable" interconnect network in terms of routability versus implementation cost. This is an ad hoc process since there are no theoretical guarantees of routability, i.e., that the desired interconnections can actually be made.

A further complication in the above empirical process has been that the demands on the interconnect network do not scale linearly with the number of logic cells in the array. In other words, an interconnect network that seems to route most designs on an array with 1 K logic cells cannot simply be replicated for a 64 K logic cell array. As seen empirically, the routing demands grow exponentially, but these demands are highly dependent on the exact algorithms used to implement the design. Specifically, it depends on the algorithms used to map the original circuit design onto the logic cells, to place the logic cells on the array, and to route (connect) the logic cells to each other. There is currently no precise theoretical model of this growth in wiring demand, although current practice has been to approximate the wiring demand with stochastic models. The use of these models entails some assumptions for certain coefficients, which are based on empirical data, and so current practice is still an ad hoc process.

In contrast, the present invention provides for an FPGA interconnection network architecture which creates interconnection networks which are "rearrangeable," i.e., any permutation of interconnections from the network's input terminals to the output terminals can be implemented. The resulting FPGA network interconnect has guaranteed routing with defined maximum timing delays and is scalable.

The present invention uses the so-called Benes network, which has been the subject of research in the telecommunications field, specifically for switching networks. Generally described, a Benes network interconnects a number of network input terminals to a number of network output terminals. Between the input and output terminals are switches, each switch itself having input terminals and a number of output terminals and the ability to pass signals on any input terminal to any output terminal. The switches are connected in hierarchical levels with a first level of switches having input terminals connected to the network input terminals and a last level of the switches having output terminals connected to the network output terminals. The levels of the switches intermediate the first and last levels are arranged in a plurality of first rank sub-interconnection networks equal to the number of switch input (and output) terminals, each first rank sub-interconnection network connected to an output terminal of each switch in the first level and connected to an input terminal of each switch in the last level. The first rank sub-interconnection networks are formed by second level switches having input terminals connected to the output terminals of the first level switches and second-to-the-last level switches having output terminals to the input terminals of the last level of switches. The levels of switches intermediate the second and second-to-the-last level are arranged in a plurality of second rank sub-interconnection networks equal to the number of switch output terminals with each second rank sub-interconnection network connected to an output terminal of each second level switch and connected to an input terminal of each second-to-the-last level switch.

A switch level hierarchy is formed because each rank sub-interconnection network is formed like the rank sub-interconnection network above. That is, each rank sub-interconnection network is formed by a plurality of switches in one level, the switches having input terminals connected to output terminals of switches of a sub-interconnect network rank immediately higher; and a corresponding level of switches having output terminals connected to input terminals of switches of the sub-interconnect network ran immediately higher; and the levels of the switches intermediate the switches in the one and corresponding levels arranged in a plurality of lower rank sub-interconnection networks equal to the number of switch output terminals, each lower rank sub-interconnection network connected to an output terminal of each switch in the one level and connected to an input terminal of each switch in the corresponding level. to define the hierarchical level arrangement of the switches.

The particular Benes network described immediately below explains the switch hierarchy with specificity. This network is also useful to implement an FPGA according to the present invention.

Benes Network with 2×2 Switches

Figure 2A:
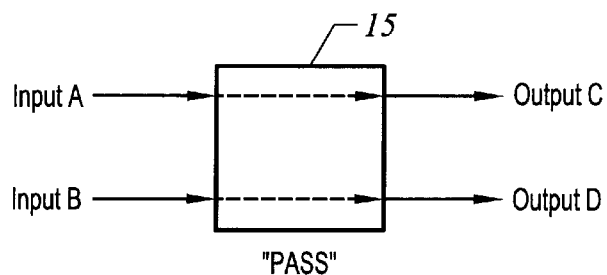
FIG. 2A is a diagram of one operation of a 2×2 switch for a Benes network.
Figure 2B:
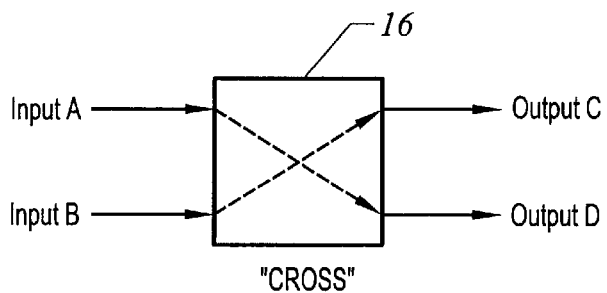
FIG. 2C is a block diagram of the elements of a 2×2 switch.

The building block of the described Benes network is the 2×2 (2 input, 2 output) switch 20, having operations illustrated in FIGS. 2A and 2B. The 2×2 Benes switch 20 has two possible configuration modes: pass and cross. In pass mode illustrated by FIG. 2A, a signal on input A is passed straight to output C, and a signal on input B is passed straight to output D. In cross mode illustrated by FIG. 2B, a signal on input A crosses over to output D and a signal on input B crosses over to output C. A single configuration or control bit can control these two modes.

The switching itself can be implemented with two 2:1 multiplexers or MUX's as shown by FIG. 2C. The switch 20 has two MUXs 21 and 22 having two input nodes which are each connected to one of the input terminals, input A or input B, of the switch 20. The output node of the MUX 21 forms the output terminal, output A, and the output node of the MUX 22 forms the output terminal, output B, of the switch 20. Both MUXs 21 and 22 are connected to a control line 23 which carries the configuration or control bit. The entire switch cell only requires 18 transistors in a CMOS (Complementary Metal-Oxide-Semiconductor) implementation of an integrated circuit.

Figure 3A:
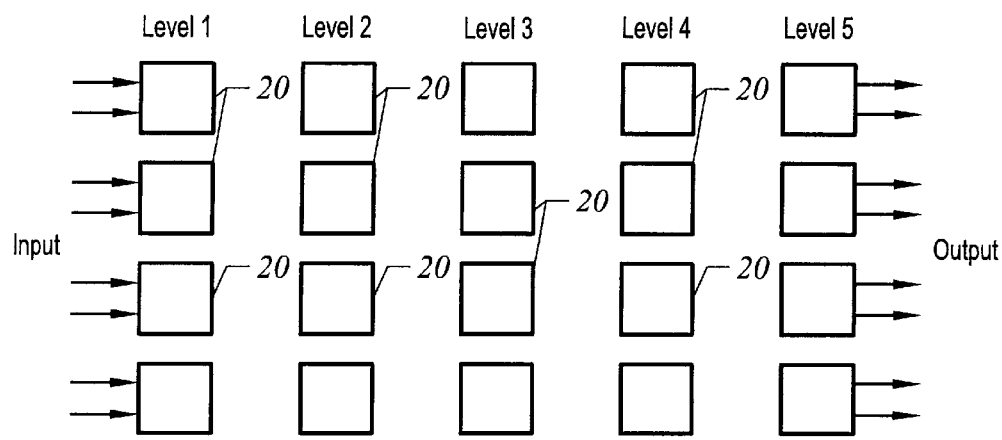
FIG. 3A illustrates the organization of an 8×8 Benes network with 2×2 switches in accordance with one embodiment of the present invention.
Figure 3B:
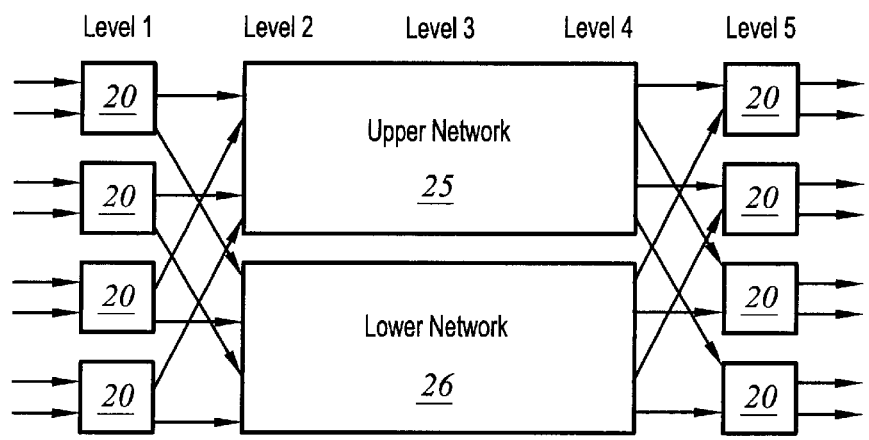
FIG. 3B illustrates the interconnection between the switches at the first rank of hierarchy.

These 2×2 switches are connected in a specific topology to build a Benes network. For the purpose of illustration, the arrangement of the 2×2 switches 20 in an 8×8 Benes network is shown in FIG. 3A. For a network with N inputs and N outputs, N being a power of 2, there are (2*($\log_2 N$)−1) levels of switches, each level consisting of N/2 switches. In this example of an 8×8 network, each level has 4 switch cells and there are 5 levels. The interconnection between the switches 20 can best be understood by viewing the network in a hierarchical arrangement, starting from the outside and proceeding inwards. We can view the two outermost levels, levels 1 and 5, in detail and view the inner levels as hierarchical blocks, as illustrated by FIG. 3B. The inner levels can be viewed as two hierarchical blocks, an Upper Network 25 and a Lower Network 26. In level 1, each switch cell 20 has one output going to the Upper Network 25, and one output going to the Lower Network 26. Similarly in level 5, each switch cell has one input from the Upper Network 25, and one input coming from the Lower Network 26.

Figure 3C:
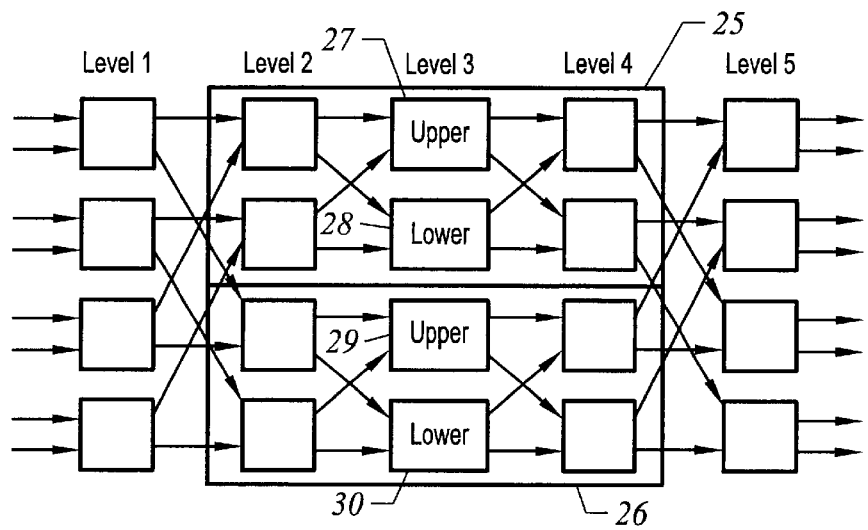
FIG. 3C illustrates the interconnection between the switches at the next lower rank of hierarchy.

At the next level of the hierarchy of the Benes network, the details of the Upper Network 25 and the Lower Network 26 are expanded in FIG. 3C. The Upper Network 25 is formed by switches 20 in levels 2 and 4, and Upper and Lower Networks 27 and 28 respectively. The Lower Network 26 is formed by switches 20 in levels 2 and 4, and its own Upper and Lower Networks 29 and 30 respectively. Each of these networks 27–30 are half the size of the higher level networks 25 and 26 and are similarly decomposed into their own Upper and Lower Networks: In this example of an 8×8 network, the bottom of the hierarchy has been reached since the lower level networks 27–30 are switches 20 in level 3. For larger networks, similar decomposition into the Upper and Lower Networks may be performed until the bottom of the hierarchy is reached. The complete interconnection of the constituent switches 20 in the 8×8 Benes network is illustrated by FIG. 3D.

Figure 3D:
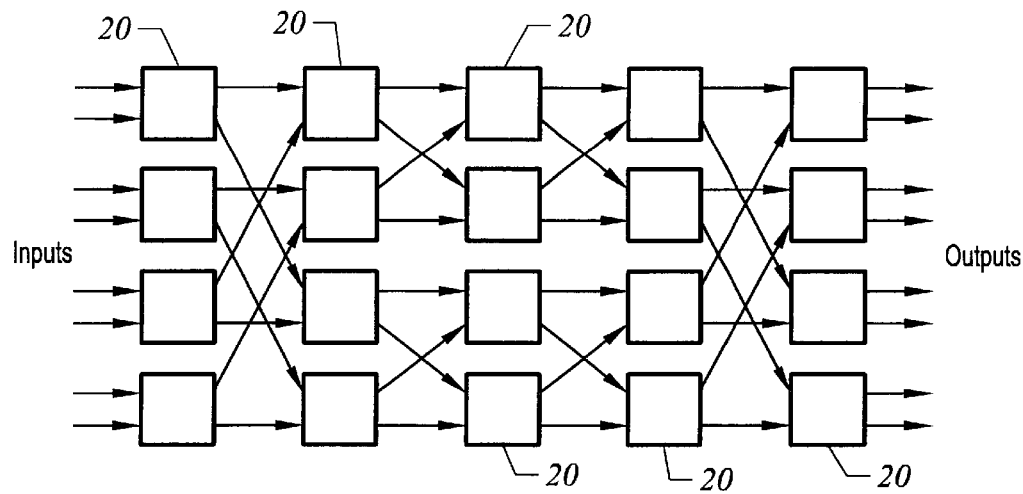
FIG. 3D shows the complete interconnection of the 8×8 Benes network.
Figure 3E:
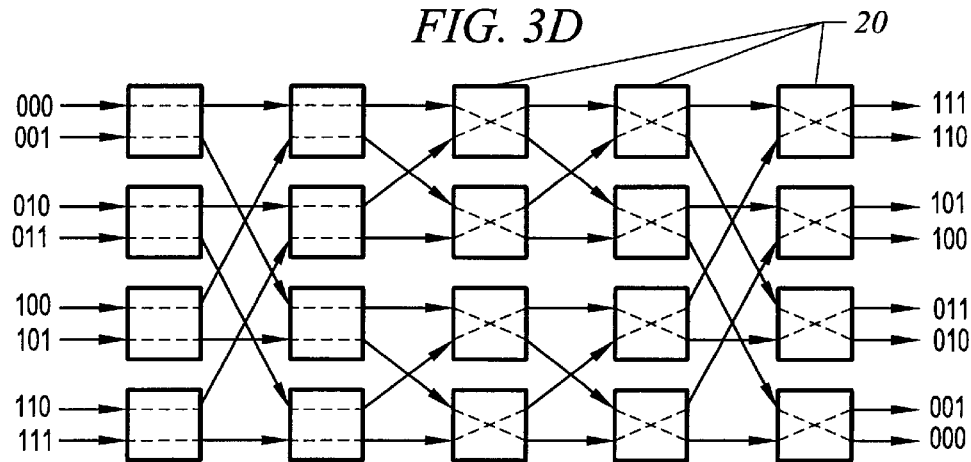
FIG. 3E is an example of a permutation of connections in the 8×8 Benes network to reverse the order of input signals at the output terminals of the network.

The Benes network of FIG. 3D is not configured with only the hard-wired connections between the switch cells 20 illustrated. This network can potentially implement any permutation of signals on input terminals to output terminals. In order to configure the network to implement a specific routing, each switch cell 20 must be individually configured as either "pass" or "cross" mode described previously. The example of FIG. 3E shows the configuration of the network to implement an order reversal from the inputs to the outputs:

Note that there are many variations of the Benes network. The hierarchical sub-division into Upper and Lower networks can be generalized to more than 2 sub-networks, so networks of the size $p^n$, p>2, can be constructed. Also, the sub-division does not require that the sub-networks be of equal size. This generalized construction leads to overall Benes networks with arbitrary numbers of inputs and a proportional number of switch cells. All variants are simply be referred to as Benes networks.

The Benes network is a very powerful and efficient interconnection network with guaranteed routability. Its use has not been more widespread because of the complexity of the algorithm required to determine the appropriate configuration of the switches for a specific routing. The Benes network is "rearrangeable," but not "non-blocking." Non-blocking means that any input-to-output connection can always be made, even if there are already existing connections on the network. Rearrangeable is less powerful and means that any input-to-output connection can be made, but some existing connections may need to be rerouted. In the dynamic worlds of telephone switching and data communication networks, a Benes network would require that a routing algorithm be performed every time a new connection is requested. A Benes routing algorithm requires time $O(N\log_2 N)$, but the network itself transmits data in time $O(\log_2 N)$. It takes longer to reconfigure the network than to actually transmit the data through the network. Hence, current practice in the data communications has to use more expensive non-blocking switches.

However, the present invention recognizes that in the FPGA world, routing is not so dynamic. There is no real time set up and tear down of fleeting connections. Instead, in an offline process, a circuit design is mapped onto the FPGA integrated circuit once and the resulting interconnect configuration is used without change. Even in the application of FPGA technology to the burgeoning field of "reconfigurable logic", multiple configurations may be rapidly swapped in and out of the FPGA, but each configuration itself is never changed. Presently, the offline routing process in an FPGA requires on the order of minutes or even hours of execution time. In contrast, the execution of a Benes routing algorithm requires in the order of 10 seconds (which is completely unacceptable in a data communications network) in accordance with the present invention. This time is spectacularly fast and routability is guaranteed.

Specific Implementation of Benes Network in FPGAs

Figure 4A:
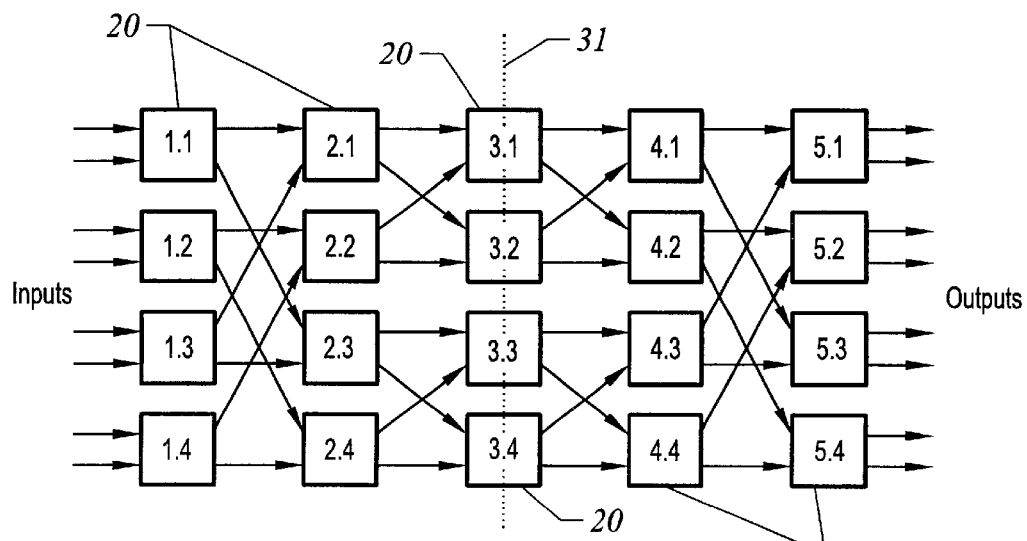
FIG. 4A shows how the 8×8 Benes network is folded for an FPGA interconnection network in accordance with an embodiment of the present invention.

There are a number of ways that the Benes network may be adapted to make it more efficient as an interconnection network for an FPGA or MPGA (Mask Programmable Gate Array). In an FPGA, the logic is composed from building blocks called "logic cells", and the logic cells contain both input and output pins. An example of a typical logic cell is a 2-input NAND gate. So an FPGA interconnection network should have neighboring "leaf cells" which correspond to the logic cells and which contain both inputs and outputs to make the connections to the logic cells. This can be accommodated by "folding in half" the original Benes network, and combining the switch cells 20 from the first level and last level, the second level and second-to-last level, and so on. This is illustrated in FIG. 4A with the 8×8 network example. The "folding" is made along the dotted line 31 which runs through the switches 20 in level 3. The switches 20 are labeled by location in the network to maintain identification through the folding operation. The first number in the labels identifies the level of the switch and the second number its row location. Hence switch with label, "4.3," is in level 4 and row 3.

Figure 4B:
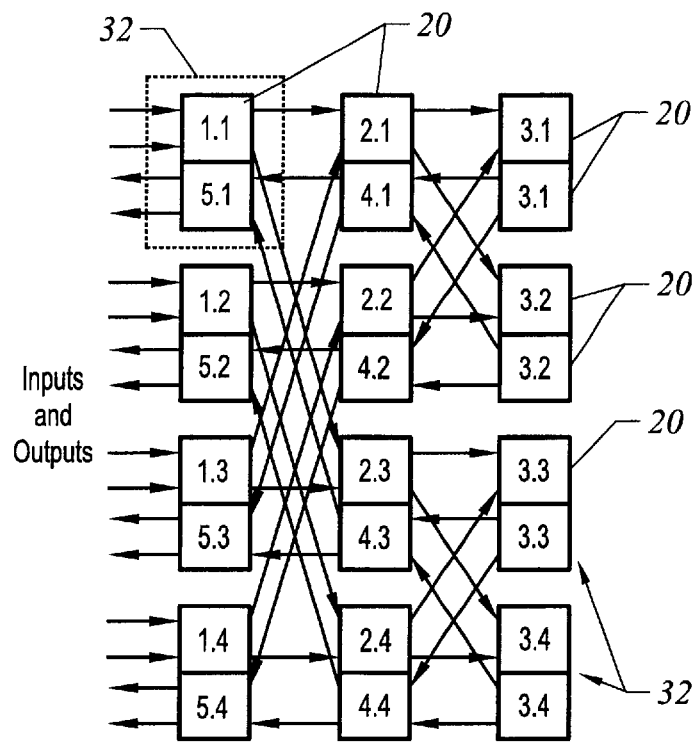
FIG. 4B shows the resulting folded Benes network.

The resulting folded network is illustrated by FIG. 4B. The switches 20 are combined into two, with the formerly level 3 switches duplicated for uniformity. While the combined switches 32 represent a topological change of the 8×8 Benes network, it should be noted that the connections between the cells 20 remain the same. The combined input and output switch cells 32 on the left of the folded network, e.g., combined switches 1.2 and 5.2, form the leaf cells for the connection to the pins of the FPGA logic cells.

Figure 4C:
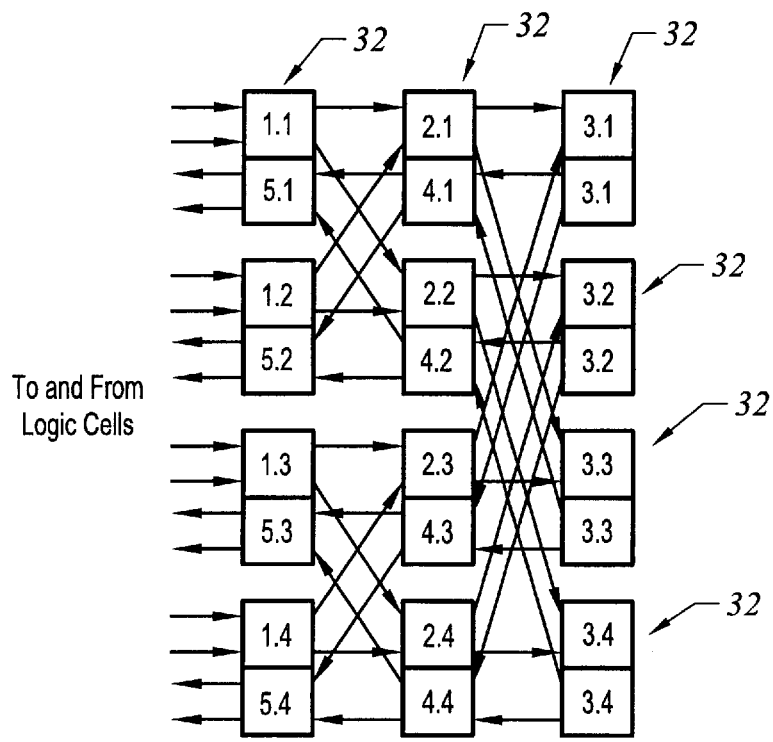
FIG. 4C illustrates the FIG. 4B folded network in which the interconnections have been inverted by level.

From the connections between the combined switches 32, the network of FIG. 4B can be turned "inside out", that is, the innermost levels of the combined switches 32 become the outermost and vice versa, as illustrated in FIG. 4C, without affecting the routability of the interconnection network. The levels with shorter connections are moved be closer to the logic cells. This is more suitable for an FPGA.

Corner Turning for Interconnection Network

Figure 5:
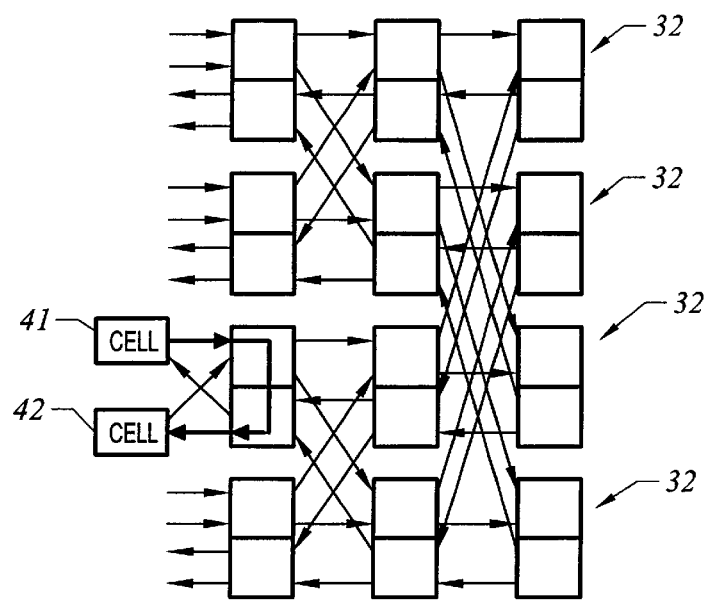
FIG. 5 shows two exemplary logic cells connected to a combined switch of the FIG. 4C network in which the combined switch provides for corner turn routing in accordance with an embodiment of the present invention.

With inputs and outputs combined into a single switch cell 32, shorter routes between logic cells which don't travel through all $2*(\log_2 N)$ levels of switches can be configured. In the original Benes network, every route must travel through all the levels to go from input to output. In the adapted interconnection network, signals from the logic can "turn the corner" before reaching the opposite side of the network. For example, in FIG. 5, logic cell 41 has an output pin that must be routed to an input pin on logic cell 42.

Of course, the particular advantage of corner turning in the interconnection network depends on the quality of logic cell placement algorithm for the FPGA. (Note that "placement" for an FPGA logic cell is not the physical placement of selected logic gates to form a desired function, but rather the programming of a selected logic cell to perform the desired function.) The algorithm is designed to minimize the distance between connected logic cells, where distance is not defined as it usually is for an FPGA or MPGA. The usual definition of distance in a placement algorithm is either Euclidean or Manhattan. In present interconnection network, distance is defined as the depth of the first common ancestor in the network because a corner can be turned at this point. The most appropriate placement algorithms build cluster trees with capacity constraints, either top-down or bottom-up. Nonetheless, regardless of the quality of logic cell placement, the present invention still provides the original worst case bound of $2*(\log_2 N)$ switches, no matter how highly the network is utilized. In contrast, current FPGA products cannot guarantee a worst case bound on signal delay when the integrated circuit is highly utilized.

Enhanced Switch for FPGAs

Figure 6A:
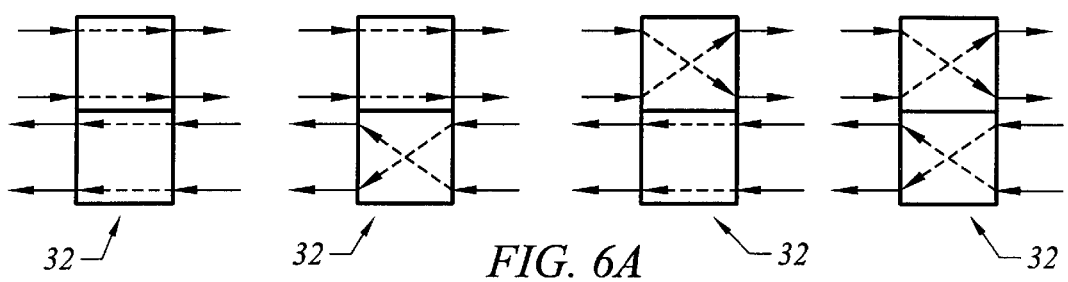
FIG. 6A illustrates the four elementary states of the combined switch.

Corner turning requires that the original Benes switch be enhanced. It should noted that the original switch had 2 states responsive to 1 configuration bit. See the description above with respect to FIGS. 2A and 2B. Just by combining the input and output switches cells, the combined switch 32 has 4 states and requires 2 configuration bits. FIG. 6A illustrates the four permutations of passing signals from the input terminals to the output terminals for the combined switch 32.

Figure 6B:
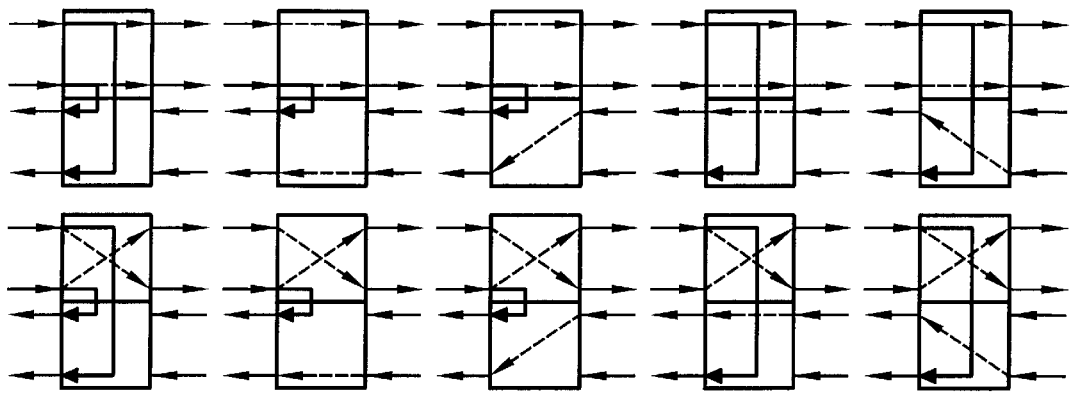
FIG. 6B illustrates 10 additional states of an enhanced combined switch for corner turn routing in accordance with the present invention.

The corner turning feature adds 5 more states for the "output" lower half of the combined switch 32. When multiplied by 2 states for the "input" upper half, there are a total of 10 new states for the combined switch 32. These additional 10 states are illustrated by FIG. 6B. It should be noted that for the corner turning states shown, there are only two possible paths to turn a corner: Each of the two possible corner turning outputs can only be connected to one of the inputs, not both inputs. The unconnected input comes from the same switch as the one the output is going to. While there may be some possible use for this connection in terms of selectively adding variable delays to certain routes, the cost of implementing additional configuration bits to all combined switch cells to support these paths is unjustified.

Figure 7:
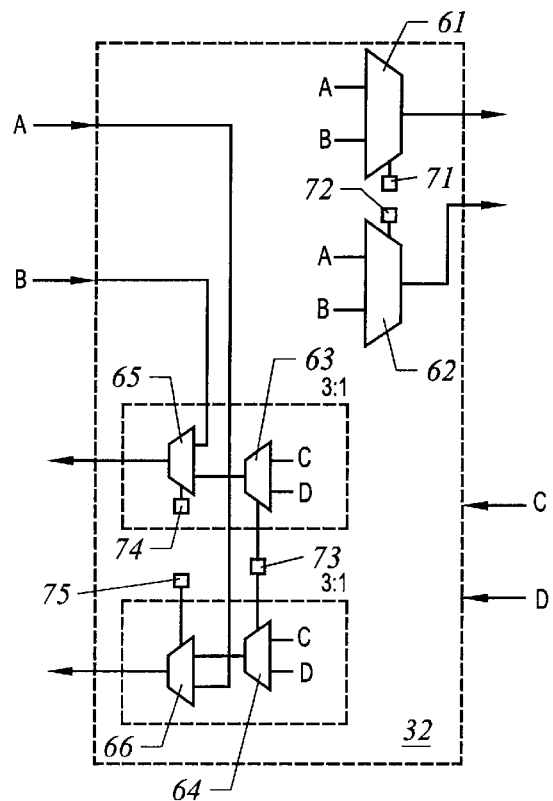
FIG. 7 is a block diagram of the enhanced combined switch described with respect to FIGS. 6A and 6B.

Of course, the increased number of states for the combined switch can not be satisfied by the two-MUX structure of FIG. 2C. FIG. 7 is a block diagram of the combined switch cell 32, which is formed by MUXs 61–66 which operate by the setting of configuration bits on five control line nodes 71–75. MUXs 61 and 62 each have terminal nodes connected to inputs A and B; control line node 71 is connected to MUX 61 and control line node 72 is connected to MUX 72. The output nodes of MUX 61 and 62 form the outputs of the combined switch 32. MUXs 63 and 65 are connected so that the output node of the MUX 63 forms one input node of the MUX 65; in effect, the MUXs 63 and 65 form a 3:1 MUX. The input nodes of the MUX 63 are connected to the reverse direction inputs C and D, and the second input node of the MUX 65 is connected to the input B. The MUXs 64 and 66 form a second 3:1 MUX. The output node of the MUX 64 forms one input node of the MUX 66. The input nodes of the MUX 64 are also connected to the reverse direction inputs C and D, and the second input node of the MUX 66 is connected to the input A. The output nodes of MUX 65 and 66 form the reverse direction outputs of the combined switch 32. The control line node 73 is connected in common to the MUXs 63 and 64. The control line node 74 is connected to the MUX 65 and the control line 75 is connected to the MUX 66.

Figure 8:
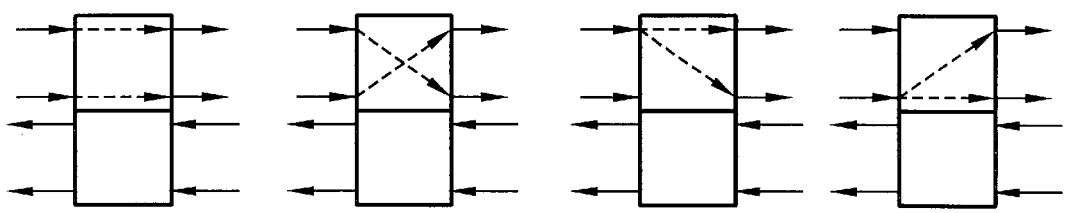
FIG. 8 illustrates the four states with the input stage of the combined switch having fanout capability.

One further enhancement is required for a interconnection network which is highly suitable for FPGAs. That enhancement is fanout support. In an FPGA, the outputs frequently fan out to multiple inputs. At the switch level, fanout can be supported in either the "output" half or the "input" half of the combined switch 32. However, in terms of routability for one-to-many connections, the fanout must be in the input half of the combined switch in order to break cyclic dependencies. Therefore, the preferred embodiment of the combined switch cell 32 has 4 states in the input half of the switch, as represented by the four states in FIG. 8.

Figure 9:
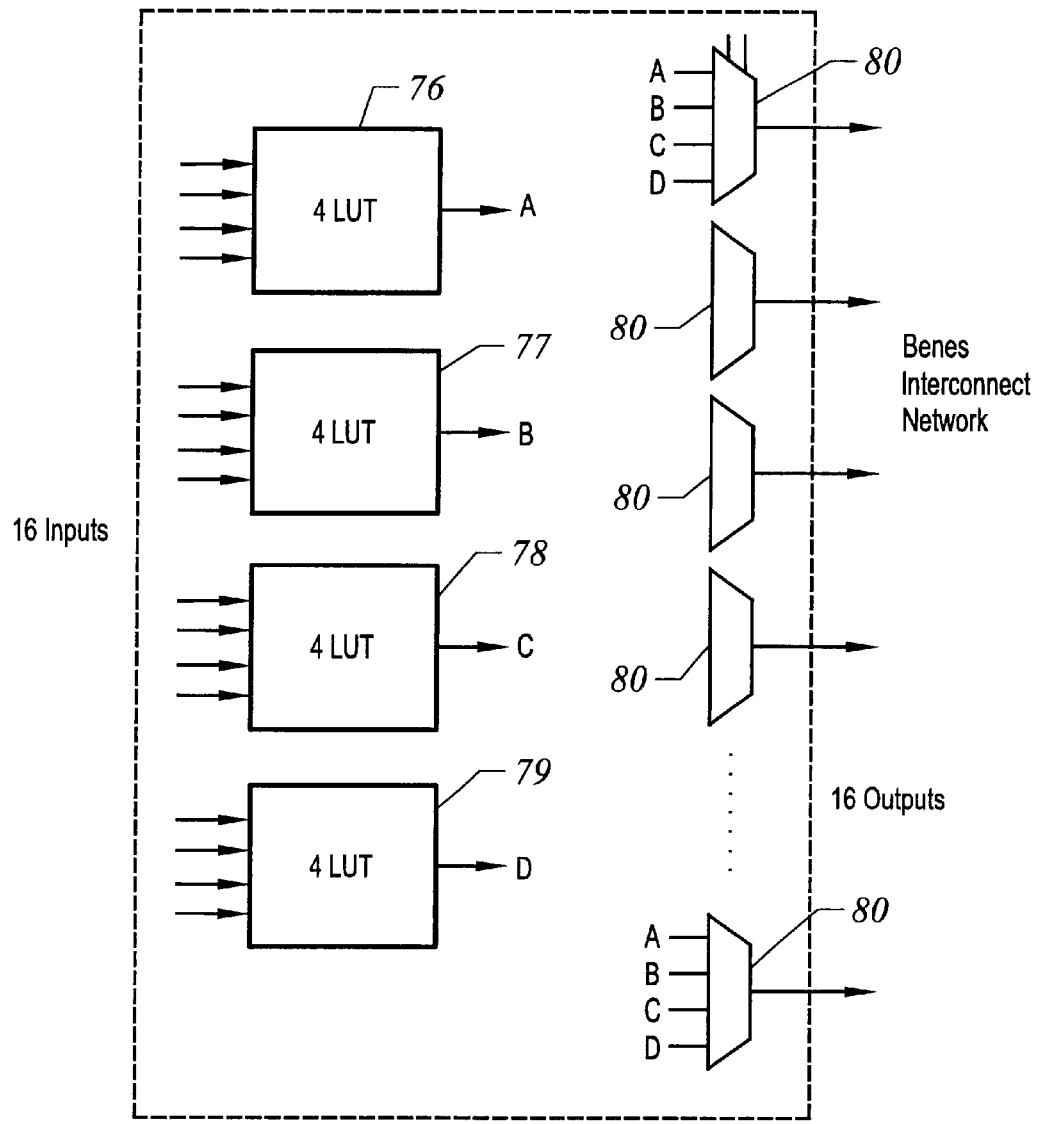
FIG. 9 illustrates an exemplary arrangement to create fanout functions with an FPGA interconnect network in accordance with an embodiment of the present invention.

An alternative way of creating the fanout function is with the use of logic cells which are connected through MUXs to the interconnect network. Such an arrangement avoids the placing of additional functionality upon the interconnect network itself. An example of this arrangement is shown in FIG. 9. Each logic cell is a 4-LUT (4 input Look Up Table). There are four 4-LUTs 76–79 (having a total of 16 inputs) with 4 outputs A–D respectively. These outputs A–D are connected to the input nodes of each of 16 MUXs 80 which have a total of 16 outputs. These outputs (as the inputs to the 4-LUTs 76–79), in turn, are connected to the enhanced combined switch cells of the first (and last) levels of the described Benes interconnect network. Through control signals on the MUXs, the outputs A–D can be selectively placed into the interconnect network. With the repetition of one of the 4LUT outputs A–D into the interconnect network, a fanout is effectively created.

Hence, with the 7 possible states on the output half of the combined switch, the enhanced switch has a total of 28 states. A switch cell appropriate for an FPGA interconnect network has been created from a simple 2-state switch cell which requires 1 configuration bit and capable of being implemented with 18 transistors in CMOS. The 28-state combined switch cell requires 5 configuration bits and can be implemented with 74 transistors in CMOS. The most expensive enhancement, in terms of silicon area, is the corner turning feature. Without corner turning, the combined switch cell would only have 8 states, which require 3 configuration bits and can be implemented in 46 transistors in CMOS. This is about a 38% reduction in silicon area for the interconnect network alone. For the purpose of analysis, assuming the logic cell is a 4-LUT (4-input Look-Up Table) with a latched output and the array is built with 16 K logic cells (a 64 K gate equivalent), a 33% reduction in the total FPGA area may be achieved. Table A below compares the results of a combined switch cell with and without corning turning:

TABLE A

|  | Switch Cell Transistors | Logic Cell Transistors | Area Per Transistor | FPGA Total Area | FPGA Area Percentage |
| --- | --- | --- | --- | --- | --- |
| With Corner Turning | 74 | 270 | 0.000004 | 153 | 100% |
| Without Corner Turning | 46 | 270 | 0.000004 | 102 | 67% |

As discussed previously, corner turning is highly desirable for reducing the signal delay due to routing. The FPGA user should be able to make the design tradeoff whether a specific project needs a faster chip or a smaller chip. The interconnect network according to the present invention provides many options to the FPGA user. An even higher speed, larger area alternative is discussed below.

Pipelined Interconnect and Predictable Delays through the Interconnect Network

Even with the enhanced combined switch, the present invention provides for further improvement. The biggest problem in semi-custom VLSI (Very Large Scale Integration) design today is the signal delays due to an integrated circuit's interconnection network. With deep sub-micron fabrication processes and its thin resistive wires, the delay due to interconnect dominates any delay due to the logic cells. This problem is even worse in an FPGA because there is the additional interconnect delay due to the switch cells in the routing. The difficulty arises in trying to either predict or constrain the routing delays.

The current practice for VLSI design is to estimate the delay due to routing during the logic design stage. The estimation is done by statistical wire loading models or by rules-of-thumb which limit the levels of logic between clock cycles. Then the actual placement and routing of the logic is performed, and the prior estimates are usually passed on as constraints to these algorithms. However, constraint driven place-and-route algorithms are still an open problem, and so there still must be a timing verification stage after these programs are run. Usually there are timing violations and the designer has different options. He or she can try to tweak the placement and routing to meet the timing constraints. This is largely a matter of patience and luck. If this fails, he can go back and modify the logic design based on the actual timing from the place-and-route. Then he tries to place and route routine again with the hope that the process will converge and there will be no new timing violations. However, placement algorithms have been theoretically proven to be highly sensitive to even small changes, so the delay profile of the modified logic design may be very different from what was hoped. This is usually a highly iterative and lengthy process. In practice, VLSI designers have learned not to be aggressive with their timing estimates and constraints, so that the process will converge more rapidly. Most current FPGA designs only run at 50–100 MHz.

Figure 10:
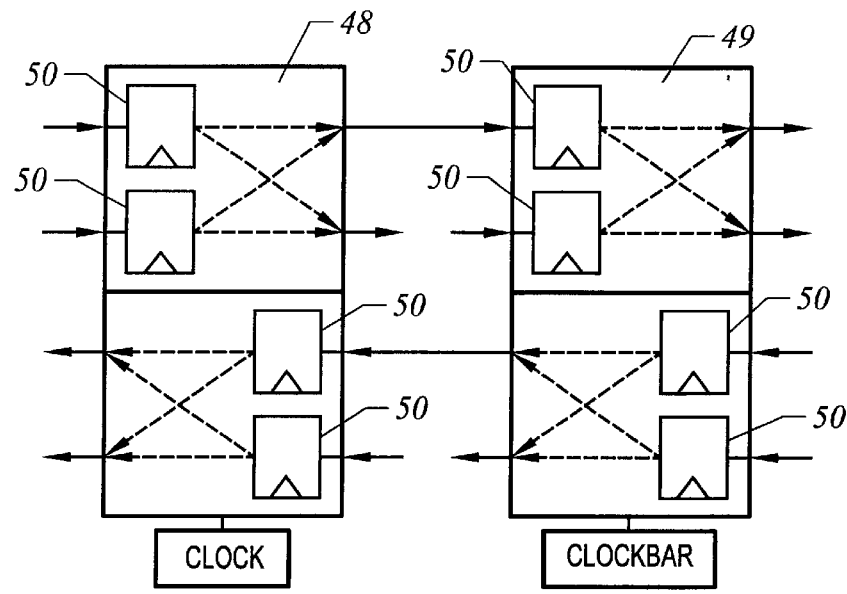
FIG. 10 shows a pair of enhanced switches with timing latches in accordance with an embodiment of the present invention.

With an interconnect network according to the present invention, a totally different design methodology is possible. All the problems arising from variable interconnect delays and the need to predict and constrain them are avoided. The described interconnect network provides for a uniform multi-stage network as illustrated in FIG. 10. A representative pair of neighboring enhanced switches 48 and 49 are shown. The inputs of the switch cells 48 and 49 have latches 50 to pipeline the signals routed through the network. The latches 50 in the switch cell 48 are responsive to one edge of a clock signal and the latches 50 in the switch cell 49 are responsive to the other edge of the clock signal. Alternating switch levels in the interconnect network can thus be rising or falling edge-triggered of a clock signal. In a fully pipelined design, the clock can operate as fast as the slowest stage in the network, and should be capable of supporting clock rates up to 1000 MHz.

To maximize throughput, every switch level of the interconnect network may be latched. On the other hand, if such a high clock rate is not needed, every few levels may be latched for a lower clock rate and throughput. Each latch requires 10 transistors to implement, so that each unlatched switch cell is 46% smaller than its latched version. Alternatively, latches may be included in every level, but with a 2:1 MUX, one input being the output of the latch and the other being the input to the latch. The MUX serves as a field programmable bypass to the latch, and allows field control of the number of switch levels between the latches. In this manner, the number of switch levels between latches and whether they include the bypass MUXs is placed under the control of the FPGA user.

For a fully pipelined design, a logic cell's input signals must arrive at the same time. The described interconnect network can disable corner turning (either in the routing algorithm or in the FPGA network generator) so that every route passes through exactly $2*(\log_2 N)$ levels and the delay is known a priori. Then the only source of signal delay variation arises from the differing levels of logic along the paths for different input pins for a given logic cell in the user's logic design.

Figure 11A:
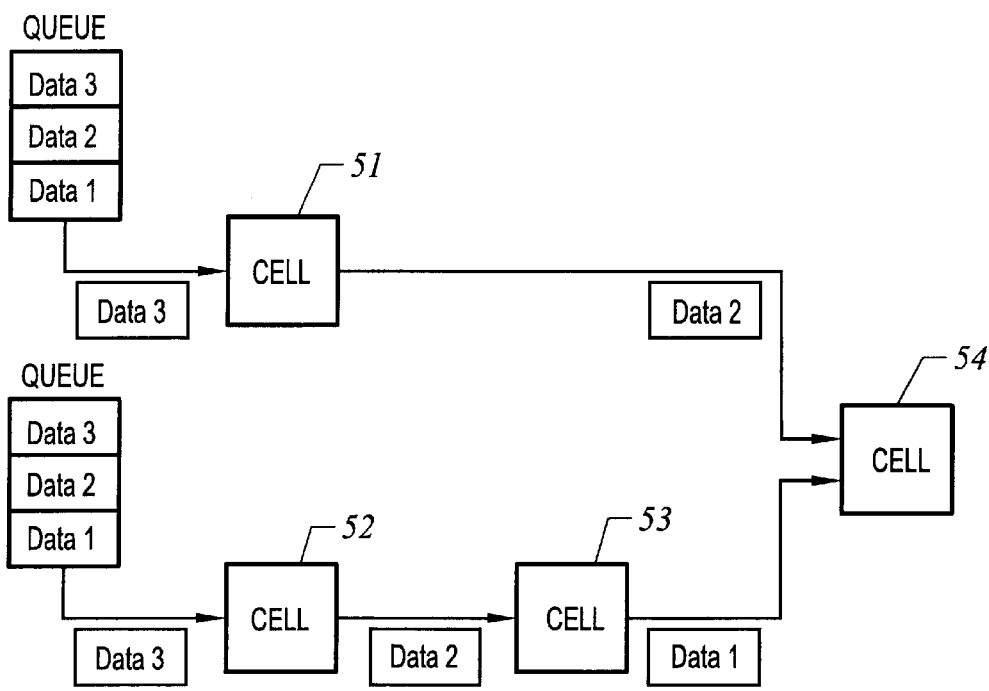
FIG. 11A is a block diagram of an exemplary circuit pipeline with mismatched delay paths.

FIG. 11A represents such an example. Two sets of data are presented in queues, one set for logic cell 51 and the other set for logic cell 52. The corresponding data from both sets are to be processed by logic cell 54. With the assumption that each route has a delay of 1 ns and each logic cell 51 and 52 has a delay of 1 ns, then the upper path (with logic cell 51) has a delay of 2 ns and the lower path (with logic cells 52 and 53 and a path between the two logic cells) has a delay of 4 ns. This design will not operate correctly in a fully pipelined mode. By the time Data 1 arrives at logic cell 54 along the bottom path, Data 1 has already passed logic cell 54 along the upper path. Instead Data 2 is present.

Figure 11B:
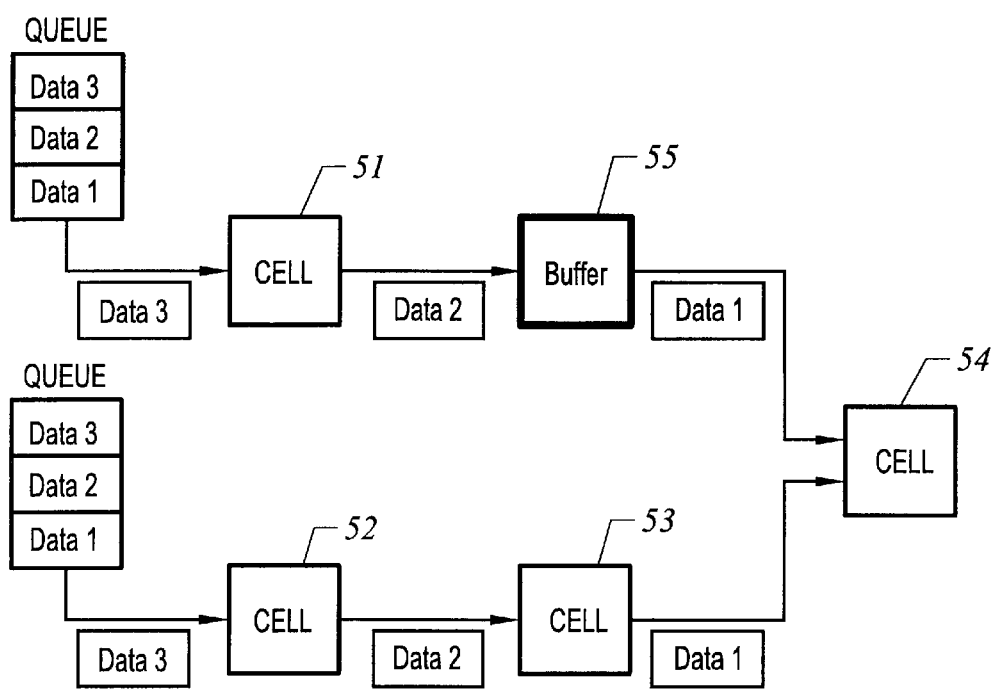
FIG. 11B is a block diagram of a modified FIG. 11A circuit pipeline with the delay paths corrected in accordance with an embodiment of the present invention.

But with a minor modification, the present invention allows the design to be pipelined and to operate the clock at 1 ns. FIG. 11B shows the insertion of a buffer 55 along the upper path between the logic cells 51 and 54. Buffers can be inserted without affecting the logic of the design. In fact, most commercial place-and-route tools will insert buffers on signals with long routing lines in order to improve their overall delay; this is done transparently for the user. The present invention allows buffer insertion to be made simply because the signal delays through the interconnect network are known.

Hence the present invention offers a methodology for fully pipelined design as follows: analyze a given netlist to identify existing mismatches in delay paths; optionally, the user may modify his or her netlist to eliminate the mismatches; for each mismatch, insert buffers to lengthen the shorter paths until the delay paths match; determine what size array is required for the modified netlist; and perform place-and-route without corner turning. This methodology does not require iteration as current methodologies do. This is because of two properties of interconnection network of the present invention: 1) the delay of every routing path is known a priori; and 100% routability for a given array is guaranteed, a property of the Benes network.

The described methodology supports fully pipelined operation at very high clock rates. It should be noted that pipelining yields a signal processing throughput proportional to the clock rate, but the signal processing latency is still proportional to the levels of logic and interconnect.

Latency Control

The present invention permits even further efforts to reduce latency. One potential drawback of using a multistage network as an interconnect network is the potentially long latency of a route. Although corner turning reduces the average length of the routing, the worst case length is still $2*(\log_2 N)$ levels, as explained above. While the performance of an FPGA with the described interconnection architecture is superior than existing FPGA products, there is room to control worst case latency. This can be done without giving up guaranteed routability, known delays, or pipeline support, but at the expense of more silicon area.

Because of the hierarchical structure of a Benes network, the Benes network can be recursively constructed. The Upper Network and Lower Network are themselves expanded into Benes networks, each with half the number of inputs and outputs of the original network. See FIG. 3B. In essence, each of these sub-networks simply guarantees a means of routing any of its inputs to any of its outputs. Functionally, this is a crossbar switch. A Benes network is a much more area efficient method of implementing a rearrangeable crossbar. The size of a Benes network grows by $N*\log_2 N$, whereas the size of a crossbar grows by $N^2$. However, maximum latency can be reduced if just the lowest levels of Benes networks are substituted with crossbars. The following Table B illustrates the relative areas, in 0.18-micron technology, for a 16 K logic cell array:

TABLE B

| Inputs to Sub-Network | Levels Reduced | Benes Total mm2 | Crossbar Total mm2 |
|---|---|---|---|
| 16 | 7 | 9.7 | 11.0 |
| 32 | 9 | 12.1 | 24.2 |
| 64 | 11 | 14.5 | 54.3 |
| 128 | 13 | 17.0 | 122.0 |
| 256 | 15 | 19.4 | 273.7 |

Thus the replacement of the 16×16, 32×32, or even the 64×64 sub-networks in the described interconnect networks are viable and attractive options. Nonetheless, the option which should be selected depends on the constraints of the specific application.

Parameterized Array Generation

In accordance with the present invention, the described interconnect network has several options which trade off area, latency, and throughput. To take advantage of this flexibility, different families of FPGA products, each family optimized for different design objectives, may be created. Perhaps a better way is to provide an FPGA array generator program to the end user. Such a generator-based methodology allow the user to explore various tradeoffs for his or her specific application. In addition, the generator allows the end user to specify the size and shape of the array desired. This enables the user to fit an FPGA component onto a larger VLSI chip floorplan with other components, a further advantage of the present invention.

A summary of the features of the interconnect network options that have been described so far is listed in Table C:

TABLE C

| Objective | Corner Turning | Crossbars | Latches |
|---|---|---|---|
| Typical | Yes | No | No |
| Minimum Area | No | No | No |
| Minimum Latency | Yes | Yes | No |
| Maximum Throughput | No | Yes | Yes |

Figure 12:
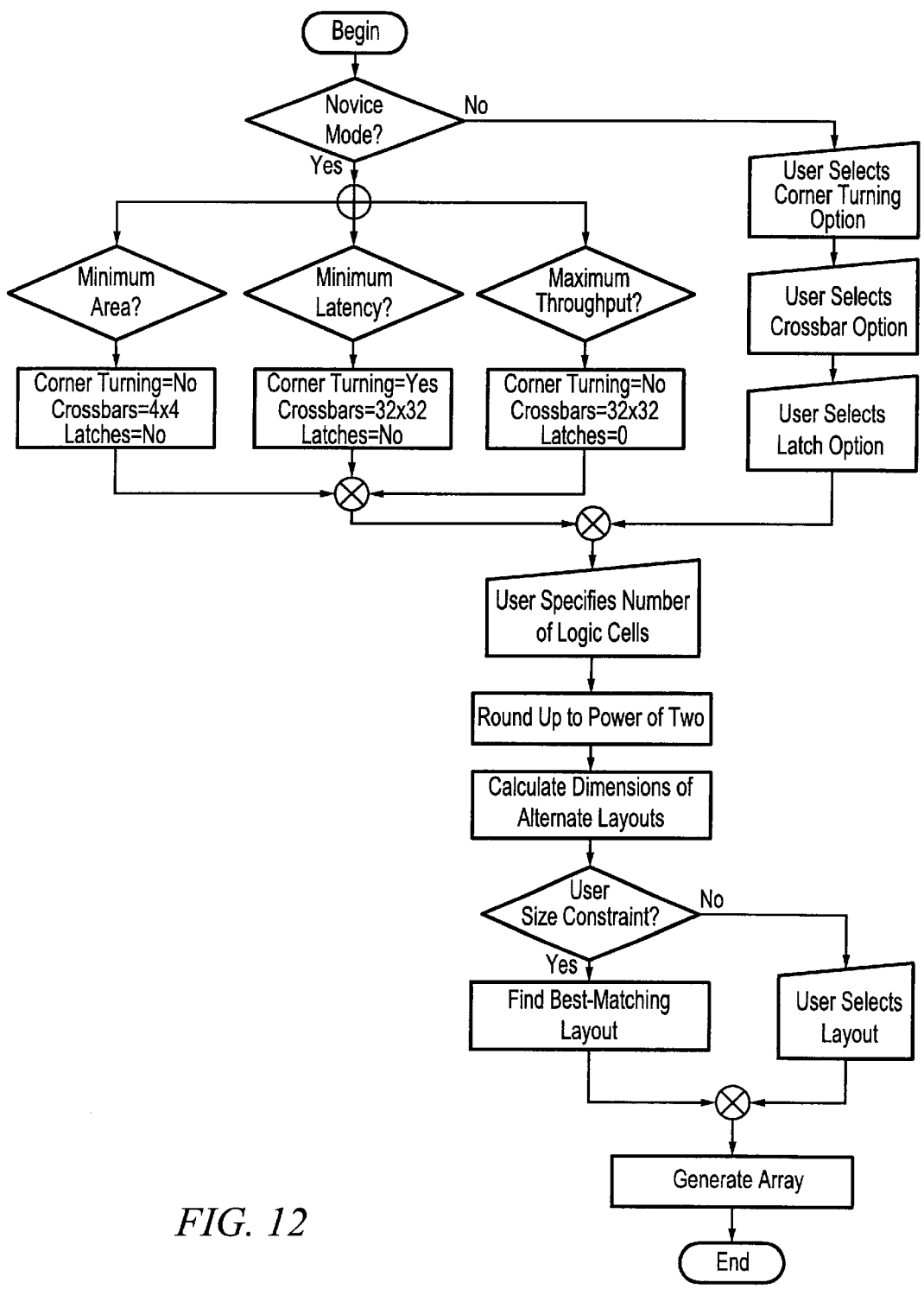
FIG. 12 is a flow chart of a software generator for an FPGA, in accordance with an embodiment of the present invention.

Each of these options is a control on the software generator having a top level flow chart as shown in FIG. 12, in accordance with the present invention. The Corner Turning control either includes or excludes the corner turning MUX's and their configuration bits for all switch cells. The Crossbar control offers a set of choices (e.g., 4, 8, 16, or 32) for the level of sub-network to be replaced with crossbars. The Latch control offers a set of choices (e.g., 0, 1, 2, or 3) for the number of levels of unlatched switches between latched switches. In addition, the generator offers a "novice user" mode for users who are not familiar with the details of the described interconnect network. In the novice user mode, there are only three choices: Minimum Area, Minimum Latency, or Maximum Throughput. Selection one of these choices instructs the generator to set the Corner Turning, Crossbars, and Latches options with appropriate defaults.

Besides the above options for the generation of the interconnect network, the generator also accepts parameters for the other components of the FPGA array. The user can specify the total number of primary IO's (Input/Output terminals) for the array. Optionally, the number of IO's per side (north, east, west, or south) can be specified. If the number of IO's per side is not specified, the total number of IO's are evenly distributed around the array. In addition, if the sides have been specified, a list of the exact offset location for each IO may optionally be specified. The generator performs all the necessary design rule checks. For the logic cells, the user can specify the total number of logic cells desired and the generator then rounds up to the nearest power of two. After the number of logic cells is specified, the generator offers a choice of feasible layouts with their various width and height dimensions. Optionally, the user may specify either a maximum width or a maximum height, and the generator automatically selects the layout which most closely conforms to this constraint.

Lastly, the Generator can be incorporated into a broader automated methodology which includes the user's design logic synthesis. From the output of the logic synthesis program, the methodology automatically determines the number of primary IO's and logic cells, and then invokes the generator with these parameters. An optional "fudge" factor can be specified by the user (e.g. 10%) to instruct the generator to create an array with the specified number of additional logic cells over the number required by the synthesized logic.

Because the array is field programmable, the user may wish to specify more logic cells than are absolutely required by the given design. These extra cells can be used in the field to accommodate future bug fixes and enhancements. It is even possible to accommodate a user who has only a general idea of the logic design, but can specify the maximum gate count anticipated, and does so in order to begin the manufacturing of his or her ASIC (Application Specific Integrated Circuit) before the final logic design is finished. It is also possible to accommodate the user who wants a single array to be able to accept more than one design. For example, the user may want his product to be able to interface many alternative external memory devices, each requiring different protocols or timing, and the final selection of interface is field configurable.

Layout for FPGA Array

There are two viable floorplans to map the topology of present invention's interconnect network onto a physical layout, i.e., on the surface of the substrate of an integrated circuit. The first floorplan is tree-based, and the second floorplan is column-based. Each floorplan has its own advantages and disadvantages.

Figure 13A:
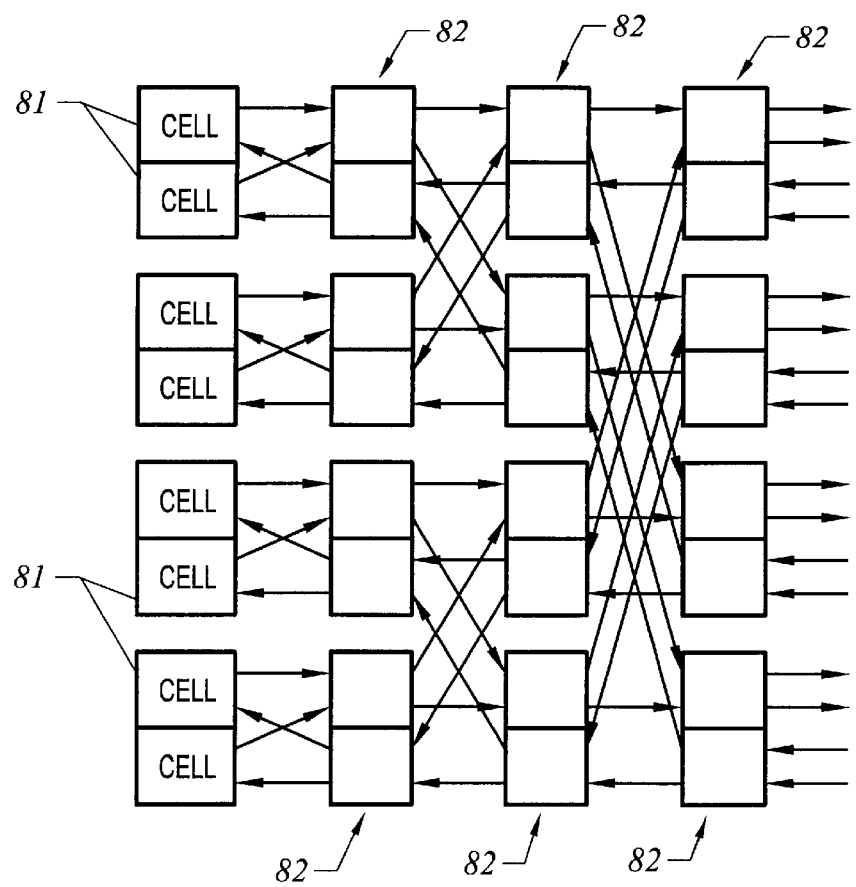
FIG. 13A illustrates an exemplary column-based floorplan layout of an FPGA according to an embodiment of the present invention.

The most straightforward mapping is column-based. With the previous illustrations of the Benes interconnect network and columns of logic cells added, the layout is nearly completed. See FIG. 13A. There are two logic cells 81 per switch cell 82, connected in the so called "butterfly" pattern, consistent with the Benes network topology: More generally, an input-output pin-pair of a logic cell forms the leaves of the Benes interconnect network. So if a logic cell has many pins, there are a number of switch cells connected to it. For example, if the logic cell is a 4-input, 1-output Look Up Table (see FIG. 9), the single output pin is fanned out 4 times to form 4 pin-pairs for each cell, and there are 2 switch cells in the first level of the Benes network connecting to each logic cell.

For multiple column arrays, levels of switch cells are added to each column's sub-network. The new levels are connected together between columns in a topology consistent with a Benes network. See FIG. 13B in which a level of switch cells 83 are added to make the connection between two FIG. 13A column arrays. For each additional doubling of the number of cell columns, an additional column of switch cells must be added to each of the cell columns, and the span for connecting these new columns to each other doubles as well. As before, each column's top-level inputs and outputs are connected to the primary I/O of the FPGA.

The strength of this column floorplan is that the number of cells in a column can be any power of 2, and the number of rows can also independently be any power of 2. This enables the generation of arrays containing numbers of cells that are any power of 2, and with a selection of various aspect ratios. On the other hand, the weakness of this column floorplan is that the long inter-column connections for several levels can all pass in parallel over the same area. The floorplan may be limited by the metal pitch constraints of the semiconductor process used to manufacture the FPGA; and the floorplan may also have crosstalk problems. These issues must be addressed carefully in the leaf cell design for the software generator.

Figures 13B, 14A:
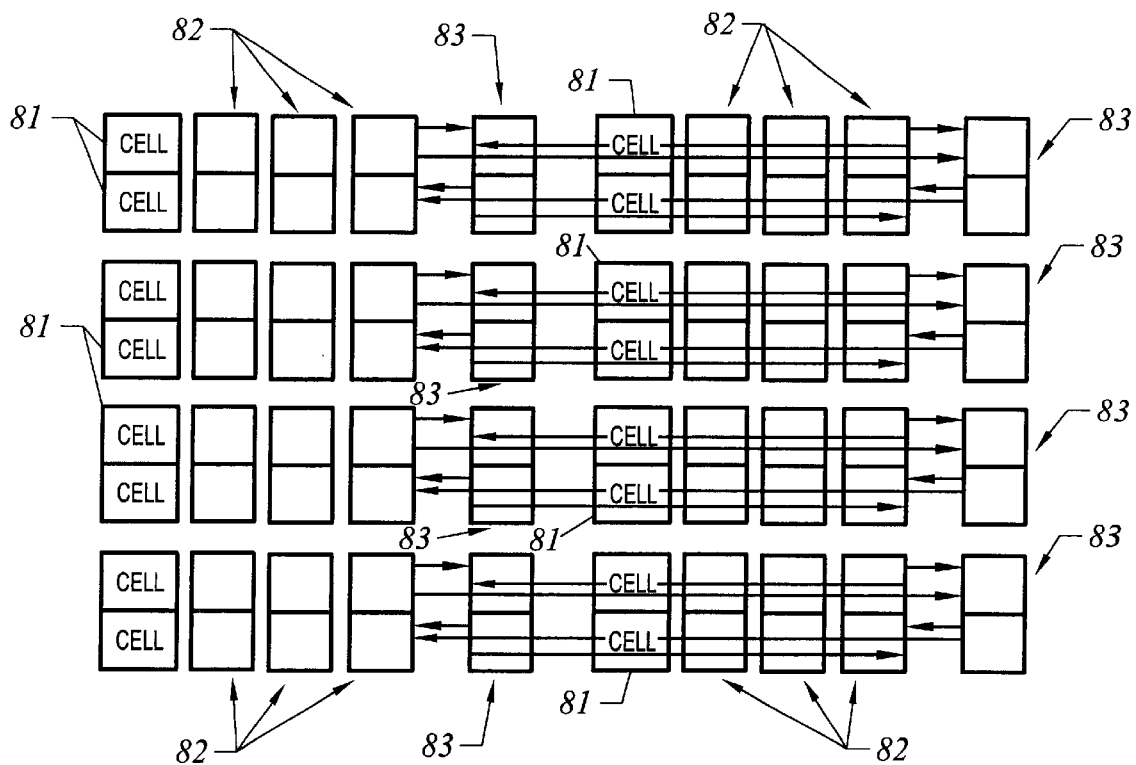
FIG. 13B illustrates how two of the FIG. 13A columns are interconnected.
FIG. 14A shows the column-based layout of FIG. 13B with all the cells labeled.
Figure 14B:
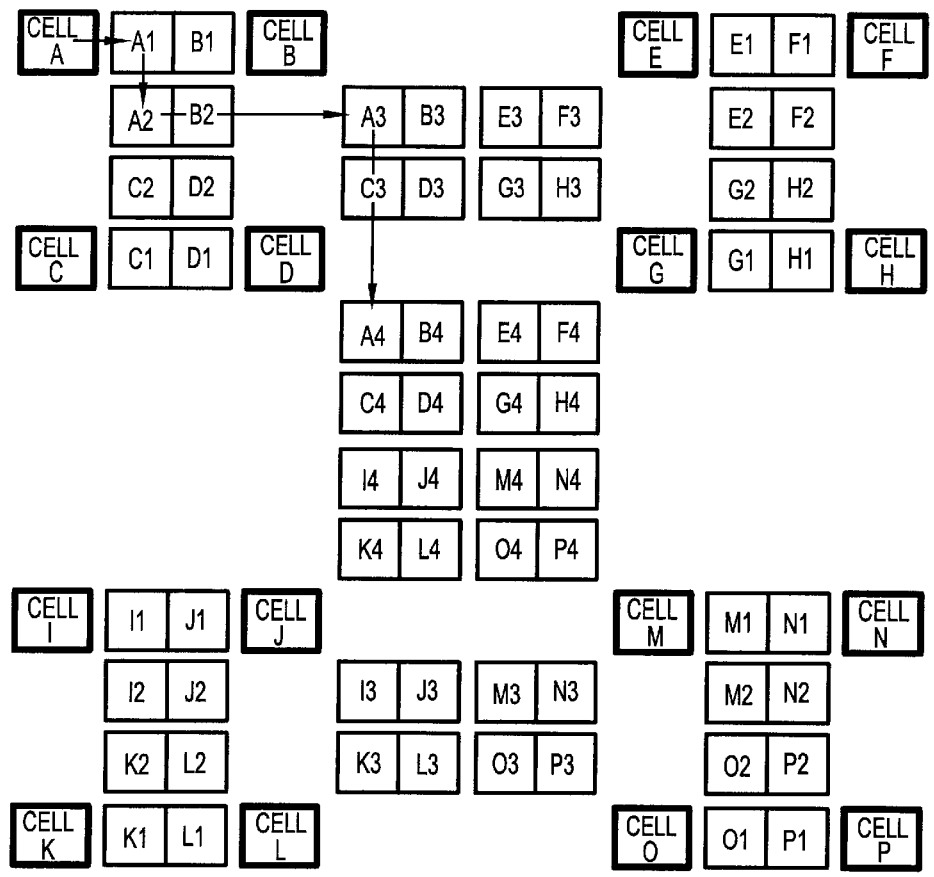
FIG. 14B illustrates the same topological network arranged in a tree-based layout in accordance with the present invention.
Figure 14C:
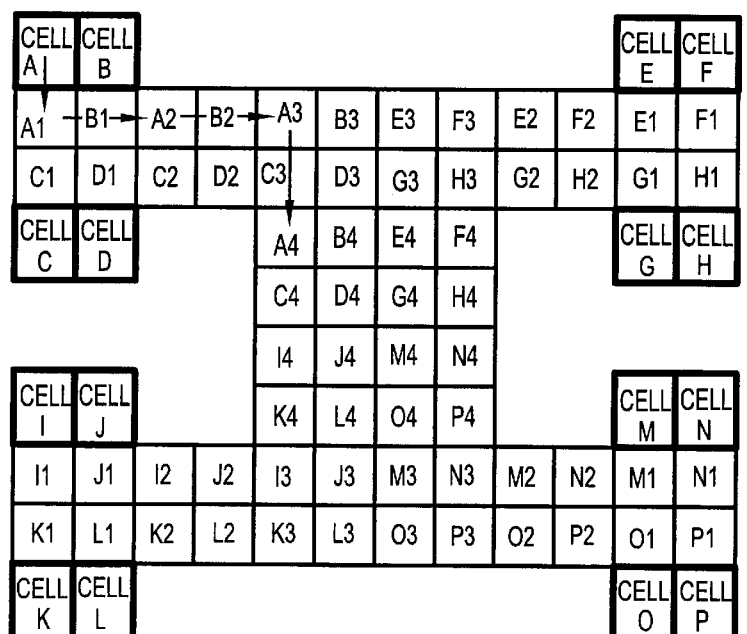
FIG. 14C shows a modification of the FIG. 14B tree-based layout with wirelengths between switch levels minimized.

The other viable floorplan maps the Benes topology onto a hierarchical tree layout. It is most clearly understood by showing the cell-to-cell correspondence with the column floorplan. FIG. 14A shows a 16 logic cell column floorplan (the same as shown in FIG. 13B) with the cells labeled for identification; FIG. 14B shows the equivalent network laid out in a hierarchical tree floorplan. The advantage of this tree floorplan is that the maximum wire length for any connection is only a quarter of the width of the substrate surface; whereas in the column floorplan, the maximum wire length is a half the width of the chip. Furthermore, in the tree floorplan the switches can be "slid" along their hierarchical connection paths in order to evenly distribute the wire lengths between levels and to thus minimize the longest wire length. FIG. 14B is used as an example of sliding the switches towards the center, where the maximum wire length is now 2, instead of the original 3. The resulting layout is illustrated in FIG. 14C.

This rearrangement, in turn, minimizes the size of the circuit drivers in the switch cells. This can be significant if the same switch cell is used everywhere in the generator. Minimizing the longest wire is also significant in pipeline operation because the clock rate is limited by the slowest level in the network. On the other hand, the disadvantage of this tree floorplan is that it does not pack the substrate surface perfectly and leaves some open spaces. Additionally, the aspect ratio of the array is fixed.

All these various floorplans still implement the same topology of the disclosed interconnect network. In fact, a straightforward software method can mechanically transform between the various floorplans, even after place-and-route has been performed. Other than the physical locations of the cells, the only remaining question is the delay of the physical interconnect wires. This can be approximated with simple resistance and capacitance models since interconnect wires have no branches. These simple models cannot account for the crosstalk and interlayer parasitics, but they should be sufficient for all the design stages before full-chip verification.

Applicability to MPGA

Finally, the disclosed Benes interconnect network can also be applied to MPGAs (Mask Programmable Gate Arrays). This is accomplished as a post-processing step where each switch cell used in the routing is replaced with either a metal via or an end-to-end concatenation of two same layer metal wires, depending on the orientation of the wires. The advantage over existing MPGA interconnect architectures is the guaranteed routability, support for pipelining, as well as the fast execution speed of the place-and-route algorithms.

While the foregoing is a complete description of the embodiments of the invention, it should be evident that various modifications, alternatives and equivalents may be made and used. For example, while the foregoing description is that of an FPGA integrated circuit, the present invention works equally well in an FPGA which forms only a portion of an integrated circuit. Furthermore, while logic cells are interconnected in an FPGA, the interconnection network of the present invention may be used to interconnect arbitrary components, such as multiple processors or peripheral blocks, of an integrated circuit. In fact, the interconnection network might be even on a separate integrated circuit and is used to interconnect separate integrated circuit devices. Accordingly, the above description should not be taken as limiting the scope of the invention which is defined by the metes and bounds of the appended claims.

What is claimed is:

1. An integrated circuit comprising
   a plurality of logic cells; and
   a rearrangeable programmable network interconnecting said logic cells, said programmable interconnection network having a plurality of programmable switches, each programmable switch having two input terminals and a number of output terminals, signals on any input terminal passed to any output terminal responsive to a programming of said switch, and each programmable switch comprising first and second multiplexers, each multiplexer having two input nodes and an output node, each input node connected to one of said input terminals and each output node connected to one of said output terminals, said first and second multiplexers responsive to a control signal so that when said first multiplexer passes a signal on said first input terminal to an output terminal connected to said output node of said first multiplexer, said second multiplexer passes a signal on said second input terminal to an output terminal connected to said output node of said second multiplexer, and when said first multiplexer passes a signal on said second input terminal to said output terminal connected to said output node of said first multiplexer, said second multiplexer passes a signal on said first input terminal to said output terminal connected to said output node of said second multiplexer, said plurality of programmable switches arranged in a Benes network so as to form a rearrangeable network.

2. The integrated circuit of claim 1 wherein said integrated circuit comprises an FPGA.

3. An integrated circuit comprising
a plurality of logic cells; and
a rearrangeable programmable network interconnecting said logic cells, said programmable interconnection network having
a plurality of programmable switches, each programmable switch having a plurality of input terminals and a number of output terminals, signals on any input terminal passed to any output terminal responsive to a programming of said switch, said plurality of programmable switches arranged in a Benes network so as to form a rearrangeable network; and
wherein said programmable interconnection network is arranged in hierarchical ranks, a first rank programmable interconnection network having input terminals and output terminals connected to said logic cells and comprising a plurality of second rank programmable interconnection networks, each second rank programmable interconnection network rearrangeable and some of said second rank programmable interconnection networks each comprising a plurality of said programmable switches arranged in a Benes network.

4. The integrated circuit of claim 3 wherein said second rank interconnection networks each comprising a plurality of third rank programmable interconnection networks, each third rank programmable interconnection network rearrangeable and some of said third rank programmable interconnection networks comprising a plurality of said programmable switches arranged in a Benes network.

5. The integrated circuit of claim 4 wherein said second rank programmable interconnection networks equal to the number of output terminals of each programmable switch.

6. The integrated circuit of claim 5 wherein said third rank programmable interconnection networks equal to the number of output terminals of each programmable switch.

7. The integrated circuit of claim 5 wherein each of said programmable switches has two input terminals.

8. The integrated circuit of claim 4 wherein each programmable interconnection network of one rank comprises a plurality of programmable interconnection networks of higher rank, each higher rank programmable interconnection network rearrangeable and some of said higher rank programmable interconnection networks comprising a plurality of said programmable switches arranged in a Benes network and at least one of said higher rank programmable interconnection networks comprises a rearrangeable crossbar network.

9. The integrated circuit of claim 8 wherein at least one of said third rank programmable interconnection networks comprises a rearrangeable crossbar network.

10. An integrated circuit comprising
a plurality of logic cells; and
a rearrangeable programmable network interconnecting said logic cells, said programmable interconnection network having
a plurality of programmable switches, each programmable switch having a plurality of input terminals and a number of output terminals, signals on any input terminal passed to any output terminal responsive to a programming of said switch, said plurality of programmable switches arranged in a Benes network so as to form a rearrangeable network; and
wherein said plurality of programmable switches are arranged in a plurality of levels so that
programmable switches in a first level have a first set of input terminals connected to said logic cells, a second set of input terminals connected to output terminals of programmable switches in a next level, a first set of output terminals connected to said logic cells, and a second set of output terminals connected to input terminals of programmable switches in said next level;
programmable switches in a last level have a first set of output terminals connected to input terminals of programmable switches in a preceding level, and a first set of input terminals connected to output terminals of programmable switches in said preceding level; and
programmable switches in an intermediate level between said first and last levels have a first set of input terminals connected to output terminals of programmable switches of a preceding level, a second set of input terminals connected to output terminals of programmable switches in a next level, a first set of output terminals connected to input terminals of programmable switches of said preceding level, and a second set of output terminals connected to input terminals of programmable switches in said next level.

11. The integrated circuit of claim 10 wherein each of said programmable switches in said first and intermediate levels is capable of being programmed to pass signals on first set of input terminals to said first set of output terminals.

12. The integrated circuit of claim 11 wherein each connection between input and output terminals of said programmable switches is characterized by a distance, the longest distance in the connections for programmable switches in one level between a second set of input terminals connected to output terminals of programmable switches in a next level and a second set of output terminals of programmable switches in said next level is shorter than a longest distance in the connections for programmable switches in said level between a second set of input terminals connected to output terminals of programmable switches in a next-to-next level and a second set of output terminals of programmable switches in said next-to-next level.

13. The integrated circuit of claim 12 wherein said first and second sets of input terminals and said first and second sets of output terminals of said programmable switches in said first and intermediate levels, and said first sets of input and output terminals of said programmable switches in said last level, each comprise two terminals.

14. The integrated circuit of claim 13 wherein each of said programmable switches in said first and intermediate levels is capable of being programmed to pass signals on each of first set of two input terminals to only one of said first set of two output terminals.

15. The integrated circuit of claim 14 wherein each of said programmable switches in said first and intermediate levels comprises a first multiplexer having two input nodes and an output node, each input node connected to one of said first set of input terminals and said output node connected to a first of said second set of output terminals, said first multiplexer selectively passing signals on either of said first set of input terminals to said first of said second set of output terminals responsive to a first control signal;

a second multiplexer having two input nodes and an output node, each input node connected to one of said first set of input terminals and said output node connected to a second of said second set of output terminals, said second multiplexer selectively passing signals on either of said first set of input terminals to said first of said second set of output terminals responsive to a second control signal;

a third multiplexer having three input nodes and an output node, a first input node connected to a first of said first set of input terminals, a second and third of said input nodes each connected to one of said second set of input terminals, said output node connected to a first of said first set of output terminals, said third multiplexer selectively passing signals on said first of said first set of input terminals, or either one of said second set of input terminals to said first of said first set of output terminals responsive to third and fourth control signals; and a fourth multiplexer having three input nodes and an output node, a first input node connected to a second of said first set of input terminals, a second and third of said input nodes each connected to one of said second set of input terminals, said output node connected to a second of said first set of output terminals, said fourth multiplexer selectively passing signals on said second of said first set of input terminals, or either one of said second set of input terminals to said second of said first set of output terminals responsive to third and fifth control signals.

16. The integrated circuit of claim 11 wherein each programmable switch has fanout support so that signals on any one input terminal of said first set of input terminals may be selectively passed to said second set of output terminals.

17. The integrated circuit of claim 16 wherein said first set of input terminals, said second set of input terminals, said first set of output terminals and said second set output terminals, each comprise two terminals.

18. The integrated circuit of claim 11 wherein said logic cells each comprises at least one look-up table responsive to input signals to said logic cell, said look-up table having an output node, said output node selectively connectable to said first set of input terminals of said first level programmable switches.

19. The integrated circuit of claim 18 wherein said at least one look-up table comprises a 4-to-1 look-up table.

20. The integrated circuit of claim 19 wherein said first set of input terminals, said second set of input terminals, said first set of output terminals and said second set output terminals of said programmable switches, each comprises two terminals.

21. The integrated circuit of claim 20 wherein each logic cell comprises four 4-to-1 look-up tables, each logic cell connected to eight first level programmable switches.

22. The integrated circuit of claim 21 wherein each logic cell further comprises 16 multiplexers, each multiplexer having input nodes connected to each output node of each multiplexer and having an output node connected to one of said eight first programmable switches.

23. The integrated circuit of claim 10 further comprising a substrate;

wherein said plurality of logic cells and said plurality of programmable switches comprise a first plurality of logic cells and a first plurality of programmable switches arrayed on said substrate, said first plurality of logic cells and each level of programmable switches aligned in a first direction and arranged in incremental levels in a second direction perpendicular to said first direction, said first level of programmable switches contiguous said first plurality of logic cells;

and further comprising a second plurality of logic cells and a second plurality of programmable switches, said second plurality of programmable switches comprising a programmable Benes network interconnecting said second plurality of logic cells as said first plurality of programmable switches with said first plurality of logic cells, and arranged in a plurality of levels as said first plurality of programmable switches, a second plurality of logic cells and a second plurality of programmable switches arrayed on said substrate, said second plurality of logic cells and each level of programmable switches of said second plurality of programmable switches aligned in said first direction and arranged in incremental levels in said second direction, said first level of programmable switches contiguous said second plurality of logic cells;

a first interconnection level of programmable switches aligned in said first direction and arranged contiguous to said last level of said first plurality of programmable switches, and having a first set of input terminals connected to a second set of output terminals of said last level of said first plurality of programmable switches, a second set of input terminals connected to a second set of output terminals of said last level of said second plurality of programmable switches, a first set of output terminals connected to a second set of input terminals of said last level of said first plurality of programmable switches and a second set of output terminals connected to a second set of input terminals of said last level of said second plurality of programmable switches, a second interconnection level of programmable switches aligned in said first direction and arranged contiguous to said last level of said second plurality of programmable switches, and having a first set of input terminals connected to a second set of output terminals of said last level of said second plurality of programmable switches, a second set of input terminals connected to a second set of output terminals of said last level of said first plurality of programmable switches, a first set of output terminals connected to a second set of input terminals of said last level of said second plurality of programmable switches and a second set of output terminals connected to a second set of input terminals of said last level of said first plurality of programmable switches;

whereby said first plurality of logic cells and programmable switches and second plurality of logic cells and programmable switches are interconnected in a Benes network.

24. The integrated circuit of claim 23 wherein said second pluralities of logic cells and programmable switches are aligned in said second direction with said first pluralities of logic cells and programmable switches.

25. The integrated circuit of claim 10 further comprising
a substrate; and
wherein said plurality of logic cells and programmable switches are arrayed on said substrate so that said plurality of programmable switches clustered together and said plurality of said logic cells located at a periphery of said programmable switch cluster, programmable switches of one level arranged closer to each other than programmable switches of a lower level, programmable switches of said first level near said logic cells, so that lengths of connection paths between any two logic cells are evenly distributed through said programmable interconnection network.

26. The integrated circuit of claim 25 wherein said plurality of logic cells and programmable switches are aligned in two directions perpendicular to each other on said substrate.

27. An integrated circuit comprising
a plurality of logic cells; and
a rearrangeable programmable network interconnecting said logic cells, said programmable interconnection network having
a plurality of programmable switches, each programmable switch having a plurality of input terminals and a number of output terminals, signals on any input terminal passed to any output terminal responsive to a programming of said switch, said plurality of programmable switches arranged in a Benes network so as to form a rearrangeable network, and each programmable switch having a plurality of latches responsive to clock signals for passing signals through said programmable interconnection network in a pipelined fashion to avoid uncertainties in signal routing delays through said programmable interconnection network, wherein at least some of said programmable switches have multiplexers connected with said plurality of latches for selectively bypassing said plurality of latches in response to control signals.

28. For an FPGA having a plurality of logic cells and a rearrangeable programmable network interconnecting said logic cells, said programmable interconnection network having a plurality of programmable switches, each programmable switch having a plurality of input terminals and a number of output terminals, signals on any input terminal passed to any output terminal responsive to a programming of said switch, said plurality of programmable switches arranged in a Benes network so as to form a rearrangeable network, wherein said plurality of programmable switches are arranged in a plurality of levels so that programmable switches in a first level have a first set of input terminals connected to said logic cells, a second set of input terminals connected to output terminals of programmable switches in a next level, a first set of output terminals connected to said logic cells, and a second set of output terminals connected to input terminals of programmable switches in said next level; programmable switches in a last level have a first set of output terminals connected to input terminals of programmable switches in a preceding level, and a first set of input terminals connected to output terminals of programmable switches in said preceding level; and programmable switches in an intermediate level between said first and last levels have a first set of input terminals connected to output terminals of programmable switches of a preceding level, a second set of input terminals connected to output terminals of programmable switches in a next level, a first set of output terminals connected to input terminals of programmable switches of said preceding level, and a second set of output terminals connected to input terminals of programmable switches in said next level, a software generator program for designing said FPGA in an integrated circuit, said software generator program comprising first code for optionally designing said programmable switches in said first and intermediate levels to be programmed to pass signals on first set of input terminals to said first set of output terminals to reduce latency of signals through said programmable interconnection network;

second code for optionally designing a plurality of latches into predetermined ones of programmable switches, said plurality of latches responsive to clock signals for passing signals through said programmable interconnection network in a pipelined fashion to avoid uncertainties in signal routing delays through said programmable interconnection network; and third code for optionally designing one or more rearrangeable crossbar networks into one or more portions of said programmable interconnection network.

29. The software generator of claim 28 wherein said software generator poses questions of minimal area and latency, and maximum throughput for said FPGA, said first, second and third codes are invoked responsive to answers to said questions.

* * * * *